US008547141B2

(12) United States Patent
Granat (10) Patent No.: US 8,547,141 B2
(45) Date of Patent: Oct. 1, 2013

(54) WIDE DYNAMIC RANGE, WIDE BANDWIDTH, VOLTAGE TO CURRENT CONVERTER (75) Inventor: Stanley M. Granat, Baldwinsville, NY (US)

(73) Assignee: Lockheed Martin Corporation, Bethesda, MD (US)

(*) Notice: Subject to any disclaimer, the term of this patent is extended or adjusted under 35 U.S.C. 154(b) by 115 days.

(21) Appl. No.: 12/771,027

(22) Filed: Apr. 30, 2010

(65) Prior Publication Data
US 2011/0267111 A1 Nov. 3, 2011

(51) Int. Cl.
H02M 11/00 (2006.01)
H03F 3/45 (2006.01)

(52) U.S. Cl.
USPC .......................................... 327/103

(58) Field of Classification Search
USPC .......................................... 327/103
See application file for complete search history.

(56) References Cited

U.S. PATENT DOCUMENTS

| 4,709,323 | A | | 11/1987 | Lien |
| 5,530,335 | A | | 6/1996 | Decker et al. |
| 5,646,518 | A | * | 7/1997 | Lakshmikumar et al. .... 323/316 |
| 5,648,731 | A | | 7/1997 | Decker et al. |
| 5,880,610 | A | * | 3/1999 | Nishizono et al. ............ 327/103 |
| 6,118,676 | A | | 9/2000 | Divan et al. |
| 6,369,618 | B1 | * | 4/2002 | Bloodworth et al. ......... 327/103 |
| 6,587,356 | B2 | | 7/2003 | Zhu et al. |
| 6,788,033 | B2 | | 9/2004 | Vinciarelli |
| 7,023,187 | B2 | | 4/2006 | Shearon et al. |
| 7,154,250 | B2 | | 12/2006 | Vinciarelli |
| 7,248,098 | B1 | * | 7/2007 | Teo ............................... 327/539 |
| 7,382,114 | B2 | | 6/2008 | Groom |
| 7,560,909 | B2 | | 7/2009 | Coleman |
| 7,596,006 | B1 | | 9/2009 | Granat |
| 7,619,323 | B2 | | 11/2009 | Tan et al. |
| 7,656,141 | B1 | | 2/2010 | Granat |
| 7,714,547 | B2 | | 5/2010 | Fogg et al. |
| 7,777,459 | B2 | | 8/2010 | Williams |
| 7,782,027 | B2 | | 8/2010 | Williams |
| 7,786,712 | B2 | | 8/2010 | Williams |
| 7,821,238 | B1 | | 10/2010 | Li |
| 7,889,524 | B2 | | 2/2011 | Lee et al. |
| 2010/0013304 | A1 | | 1/2010 | Heineman |
| 2010/0013305 | A1 | | 1/2010 | Heineman |
| 2010/0013306 | A1 | | 1/2010 | Heineman et al. |
| 2010/0013307 | A1 | | 1/2010 | Heineman et al. |
| 2010/0283322 | A1 | | 11/2010 | Wibben |
| 2011/0006743 | A1 | | 1/2011 | Fabbro |
| 2011/0043172 | A1 | | 2/2011 | Dearn |

* cited by examiner

Primary Examiner — John Poos
(74) Attorney, Agent, or Firm — Howard IP Law Group, P.C.

(57) ABSTRACT

A voltage to current converter comprising a composite amplifier arrangement having a common-base transistor for providing voltage to current conversion, the input current to common-base transistor is corrected to account for the temperature drift of the transistor and variations in the bias supply voltage.

20 Claims, 7 Drawing Sheets

WIDE DYNAMIC RANGE, WIDE BANDWIDTH, VOLTAGE TO CURRENT CONVERTER

FIELD OF THE INVENTION

The present invention relates generally to electric power conversion, and more particularly, to a voltage to current converter system.

BACKGROUND

Various circuit structures exist that map a monitored voltage to a current magnitude. These circuits often utilize some form of emitter-follower arrangement using bipolar, J-FET or MOSFET devices that exhibit voltage offsets that marginalize the transfer function accuracy. Operational amplifiers (op-amps) are often incorporated into the feedback paths of these devices in an attempt to correct these offset errors and improve precision. However, the use of op-amps reduces operating bandwidth and increases settling times. Moreover, these devices typically require input voltage levels limited to the supply voltage range of the circuit.

These limitations are problematic as many applications (for example, switched mode power conversion) require voltage to current conversion at voltage levels that are orders of magnitude greater than the circuit supply levels. And while voltage dividers may be used to lower input voltage levels between circuit supply levels, such arrangements introduce paths for noise in addition to decreasing the signal bandwidth. Moreover, digital low voltage supplies often require voltage level monitoring at fractions of the bias supply. Further still, in switched mode power converters, voltage to current transduction is required to monitor transient events, thereby requiring both wide bandwidth and fast transient response.

Alternative voltage to current converter arrangements are desired.

SUMMARY

A voltage to current converting circuit according to an embodiment of the present invention comprises a composite amplifier arrangement which separates op-amp offset voltage correction from the wide-bandwidth signal path used for voltage to current conversion. A voltage to current converter according to an aspect of the invention does not unduly limit bandwidth or response time in order to achieve precision, and can accurately provide a current proportional to voltage at levels that are above its supply levels as well as voltage levels extending below its supply levels down to zero.

A single common-base transistor is provided for basic voltage to current conversion. The transistor maintains high speed response, wide-bandwidth operation, and functionality at voltage levels above and below the supply levels of the system. A dc-stable path is operatively connected to the emitter of the common-base transistor and includes an operation amplifier. The op-amp is configured to correct for bias supply level fluctuations and transistor temperature drift. This arrangement maintains a consistent transfer function independent of the input voltage level.

DETAILED DESCRIPTION OF PREFERRED EMBODIMENTS

Reference will now be made in detail to the present exemplary embodiments of the invention, examples of which are illustrated in the accompanying drawings.

Figure 1:
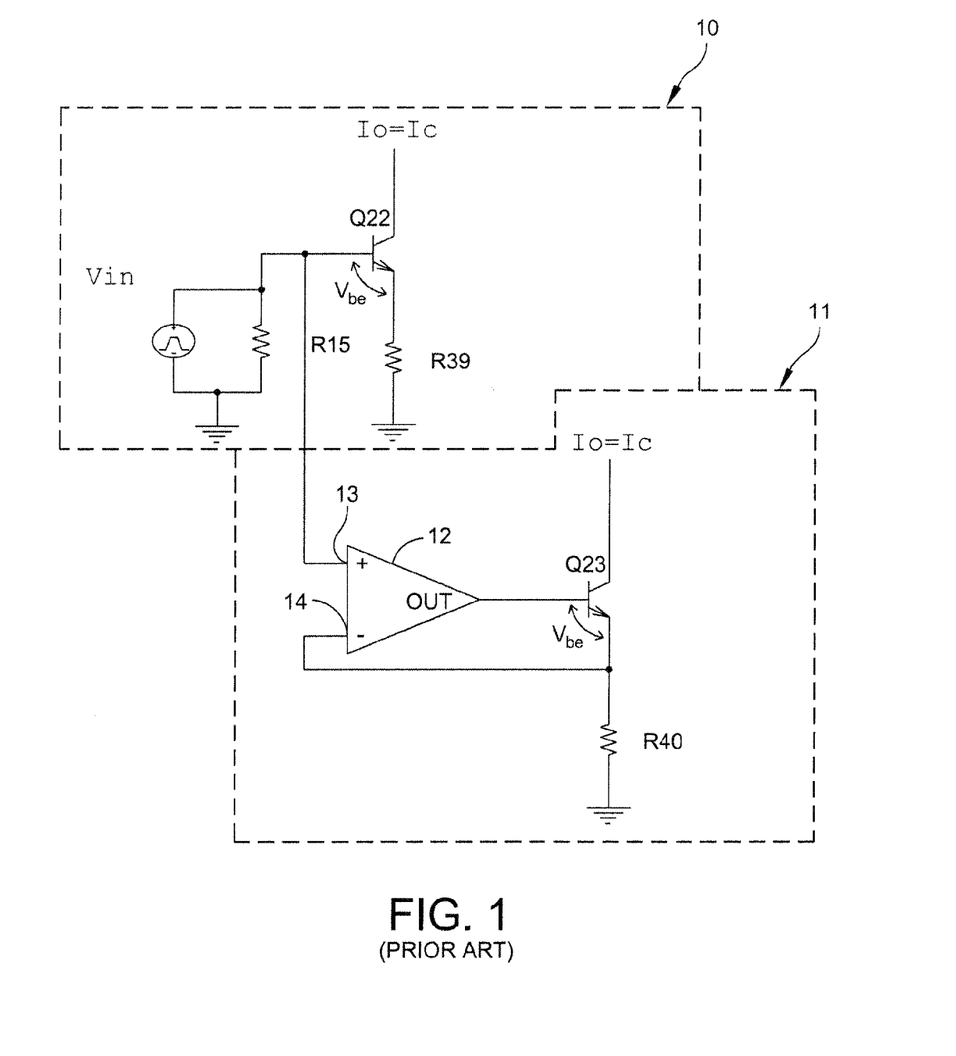
FIG. 1 is a circuit diagram illustrating two voltage to current converters according to the prior art.

With reference to FIG. 1, exemplary voltage to current converters of the prior art are shown. A first converter, circuit 10, utilizes a common-collector, or emitter-follower NPN transistor arrangement. An input voltage $V_{in}$ is provided to the base terminal of the transistor Q22 and the output collector current $I_c$ set by the base-emitter voltage $V_{be}$ and resistor R39. While this arrangement provides for fast, wide-bandwidth operation, it lacks accuracy due to voltage offset errors created by temperature drift within the transistor. Specifically, an increase in the temperature of the transistor Q22 increases its forward bias, resulting in an increase in the collector current $I_c$ despite a constant input voltage V.

Still referring to FIG. 1, several methods may be used to correct for these offset errors. For example, the emitter-follower circuit 11 of the prior art features an op-amp 12 used to correct for these offset voltages. Specifically, the non-inverting terminal 13 of op-amp 12 is connected to the input voltage supply $V_{in}$. The op-amp 12 is connected to the base terminal of transistor Q23, a common-collector NPN transistor. The base emitter voltage $V_{be}$ of transistor Q23 is tied to the op-amp's feedback path, resistor R40, connected to the inverting input 14 of the op-amp 12. Proper selection of the feedback resistor R40 will result in the op amp increasing its output in an attempt to match the inverting input level with the non-inverting input level to compensate for base-emitter drop $V_{be}$. While this arrangement provides increased accuracy over the simple common-collector arrangement, use of the op-amp in the primary voltage to current conversion channel limits operating bandwidth and increases settling time. As described above, this arrangement is further limited in that it requires input voltages to fall within the bounds of the supply voltage.

Figure 2:
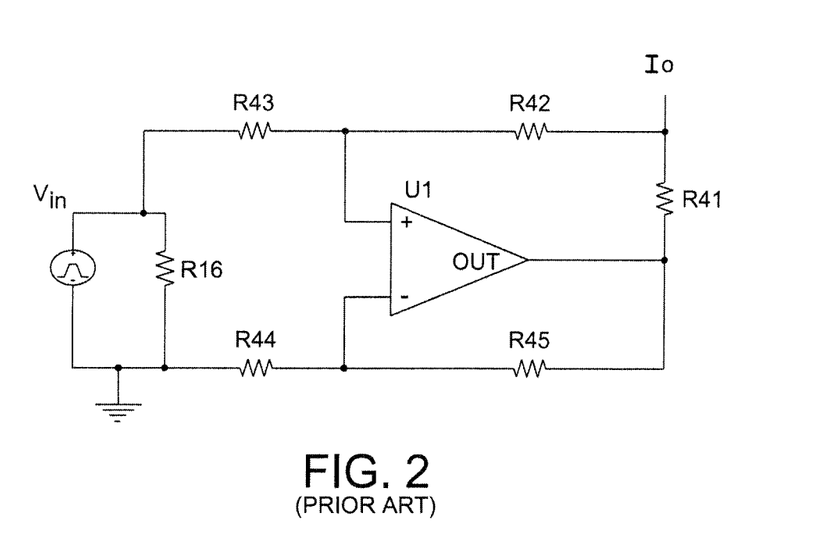
FIG. 2 is a circuit diagram illustrating a third type of voltage to current converter according to the prior art.

FIG. 2 shows a voltage to current converter of the prior art utilizing a version of a Howland circuit. This arrangement maps the differential input voltage to the op-amp U1 to the voltage drop across resistor R41. While this circuit is capable of converting input voltages above supply voltage levels, the use of the op-amp U1 in the primary voltage to current conversion channel limits the bandwidth of the circuit, and does not provide the same settling time as transistor-based devices. Moreover, this arrangement requires precisely matched resistors to provide suitable accuracy.

Figure 3:
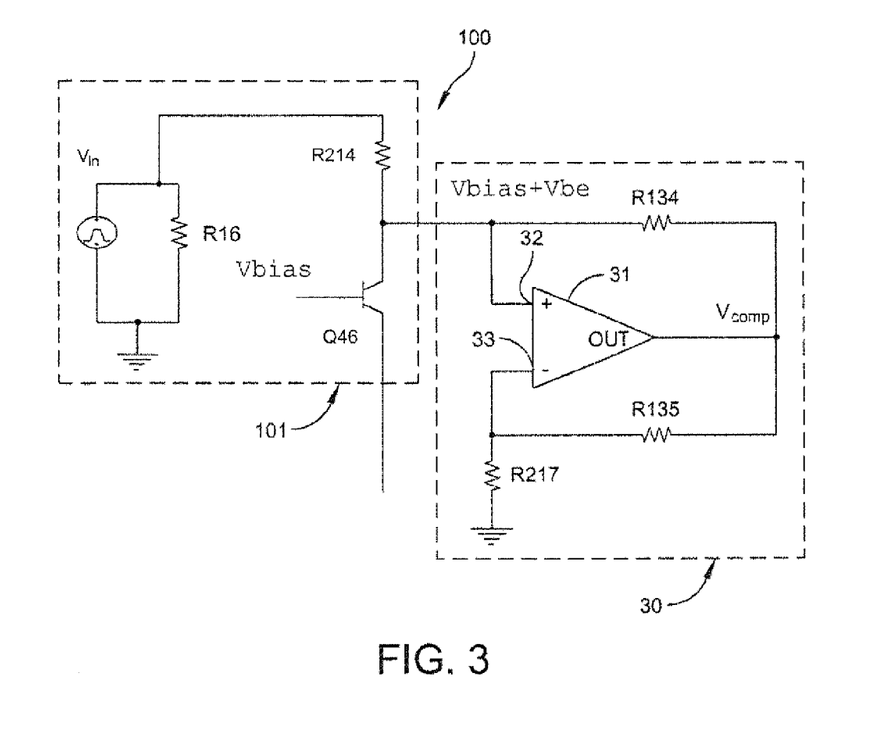
FIG. 3 is a circuit diagram illustrating a voltage to current converter according to an embodiment of the present invention.

FIG. 3 is a circuit diagram of an exemplary embodiment of a voltage to current converter according to the present invention. The converter comprises a composite amplifier arrangement 100, with separate channels for providing high-bandwidth/high-speed voltage to current conversion, and op-amp correction of voltage offset errors. The circuit of FIG. 3 converts voltage to current with a transfer function based on a single resistance value. Further, the arrangement advantageously level shifts the current source to permit use in various circuit configurations and power supply levels.

A common-base transistor circuit 101 is provided for the basic voltage to current conversion. The common-base transistor circuit 101 comprises a conventional PNP bipolar junction transistor (BJT) Q46 with its emitter terminal connected to an input voltage source $V_{in}$ and base terminal connected to a bias supply source $V_{bias}$. The output current $I_c$ is provided at the collector terminal. The bias supply $V_{bias}$ comprises a conventional voltage source which enables forward drive of current through the transistor Q46 on a continuing basis according to $V_{in}$. This arrangement provides high-speed, wide bandwidth voltage to current conversion at voltage levels both above and below the supply levels.

In an ideal circuit, the current supplied to the emitter terminal $I_e$ is a function of only the input voltage $V_{in}$ and resistor 214. However, as noted above with respect to the prior art, changes in both the temperature of transistor Q46 as well as in bias supply levels $V_{bias}$ vary the output collector current $I_c$. The circuit arrangement embodied in FIG. 3 compensates for these variations without the above-described reduction in bandwidth and increase in settling time.

An op-amp circuit 30 provides a means for this offset compensation. The non-inverting input terminal 32 of op-amp 31 is connected between the emitter terminal of transistor Q46 and resistor R214. The non-inverting input 32 is provided with an offset voltage consisting of the base-emitter voltage $V_{be}$ and the supply voltage $V_{bias}$, which correspond to temperature and supply voltage variations in transistor Q46 respectively. The op-amp 31 functions in a traditional fashion, attempting to keep the inverting input 33 equal to this offset voltage applied to the non-inverting input 32. By setting an appropriate closed loop gain of the op-amp such that the output $V_{comp}$ is slightly above the offset level ($V_{bias}+V_{be}$), the amount of current provided through resistor R134 (and applied to the emitter terminal of Q46) will compensate for the offset voltage. The following describes resistor ratios of the op-amp feedback resistors R135 and R217, as well as resistors R214 and R134 that achieve this correction.

The current through the resistor R214 is a factor of the difference between the input voltage and the offset voltage (reflected in $V_{bias}$ and $V_{be}$) and resistor R214 such that:

$$[Vin-(Vbias+Vbe)]/R214$$

Op-amp 31 amplifies this offset voltage with a gain G determined by the feedback loop (resistors R135 and R217) connected to the inverting input 33. Specifically the gain may be represented as:

$$G=(R135+R217)/R217$$

The current provided to the emitter of transistor Q46 thus comprises both the current through resistor R214 and the offset compensation current through resistor R134:

$$Ie=\{(Vin-[Vbias+Vbe])/R214\}+\{(Vcomp-[Vbias+Vbe])/R134\}$$

Simplifying the offset voltage as follows:

$$Vbias+Vbe=Vx$$

And defining $V_{comp}$ as the offset voltage multiplied by the op-amp 31 gain G:

$$Vcomp=G(Vx)$$

The current $I_e$ supplied to the emitter of transistor Q46 is reduced to:

$$Ie=(Vin/R214)+Vx\{[(G-1)/R134]-(1/R214)\})$$

As the ideal current through the emitter terminal should be set only by the input voltage $V_{in}$ and resistor R214 (Ie=Vin/R214), the $V_x$ term in the above equation should be zeroed in order to achieve ideal offset correction.

Accordingly, the resistors should be chosen as follows: Setting the gain G to an arbitrary number, for example 1.1, yields:

$$Vx\{[(G-1)/R134]-(1/R214)\}=Vx\{[(0.1)/R134]-(R214)\}$$

Setting the contents of { }=to 0 yields:

$$R214/R134=10 \text{ and } R135/R217=0.1$$

Resistance values for resistors R214, R134, R135 and R217 are chosen according to these relationships. With proper values in place, the circuit 30 provides the function of auto-correcting for variations in $V_{bias}$ as well as temperature effects and associated amplitudes reflected in $V_{be}$. In this way, precise voltage to current conversion is achieved without introducing op-amp based corrective loops into the wideband signal path.

While the above-described embodiment of the present invention is implemented with a PNP bipolar junction transistor, other types of transistors which produce offset voltages may be used, for example, a PFET, without departing from the scope of the present invention.

Figure 4:
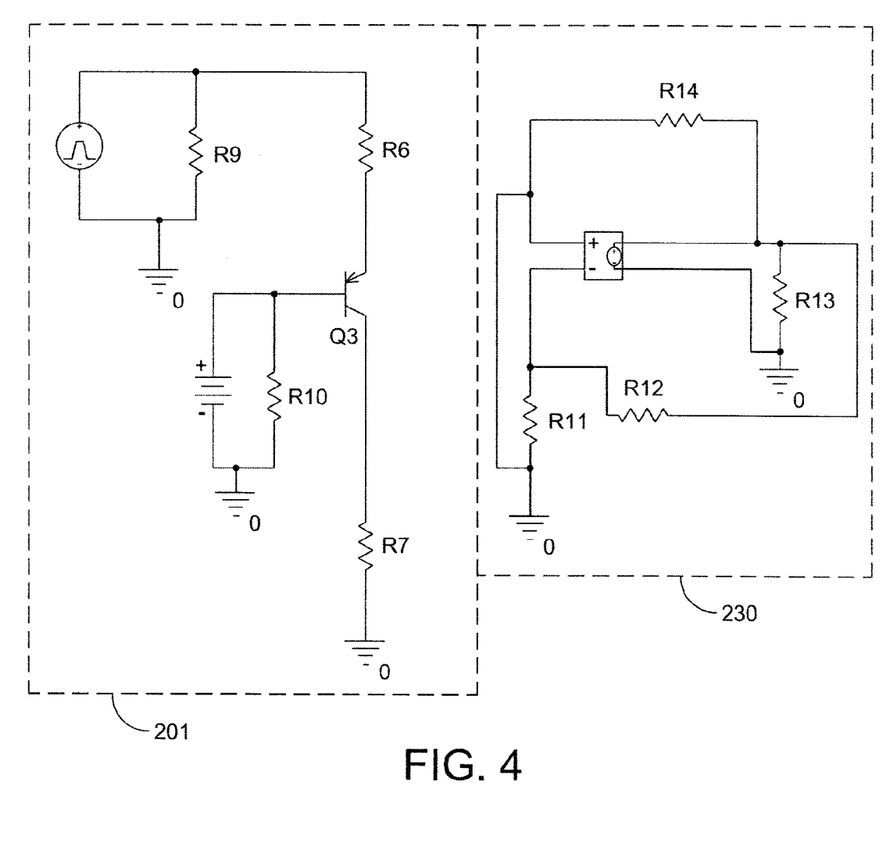
FIG. 4 is a circuit diagram of a voltage to current converter used in the simulation shown in FIG. 5, without the compensating circuit attached thereto.
Figure 5:
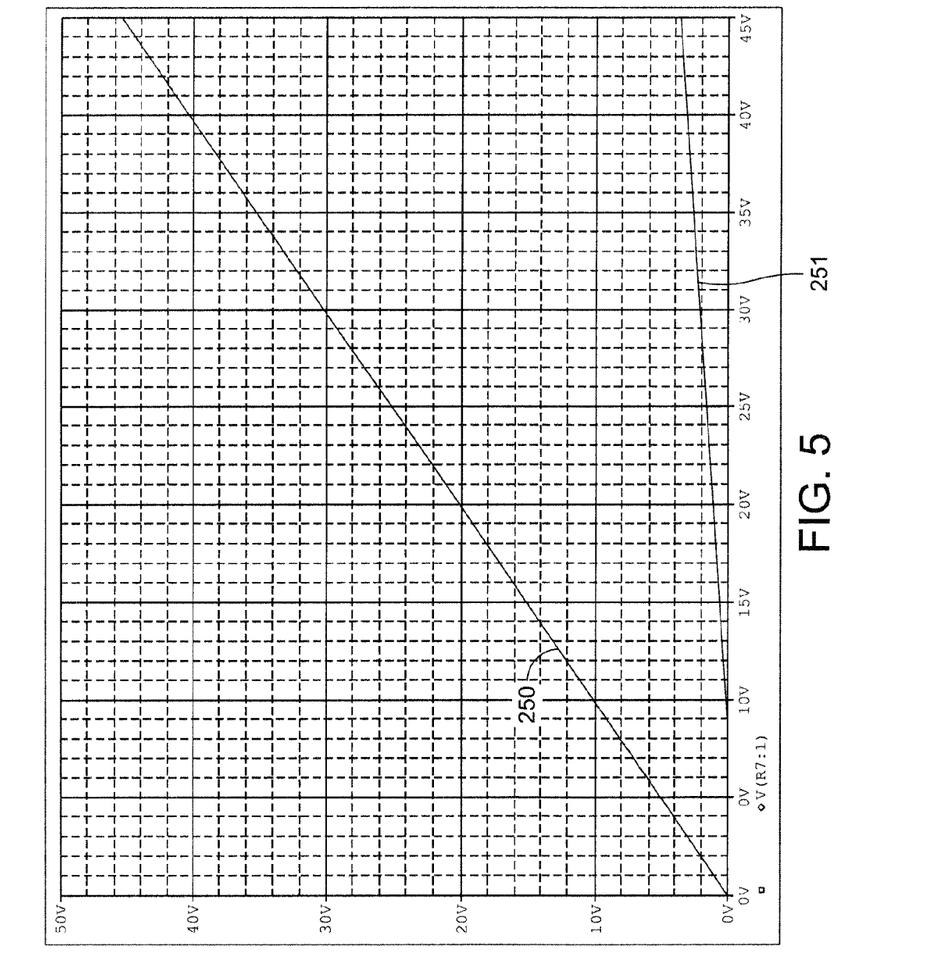
FIG. 5 is a plot showing input voltage and output voltage for the uncompensated circuit shown in FIG. 4.

FIG. 4 is a circuit diagram of a common-base transistor circuit 201 similar to that described above with respect to FIG. 3, without the compensating op-amp circuit 230 connected thereto. FIG. 5 shows a plot of the input voltage 250 and the output voltage 251 of circuit 201 under simulation. Note that no output current is produced until the input voltage exceeds approximately 8.5V (bias-supply and temperature variable base-emitter voltage), and a maximum output of less than 4V is observable.

Figure 6:
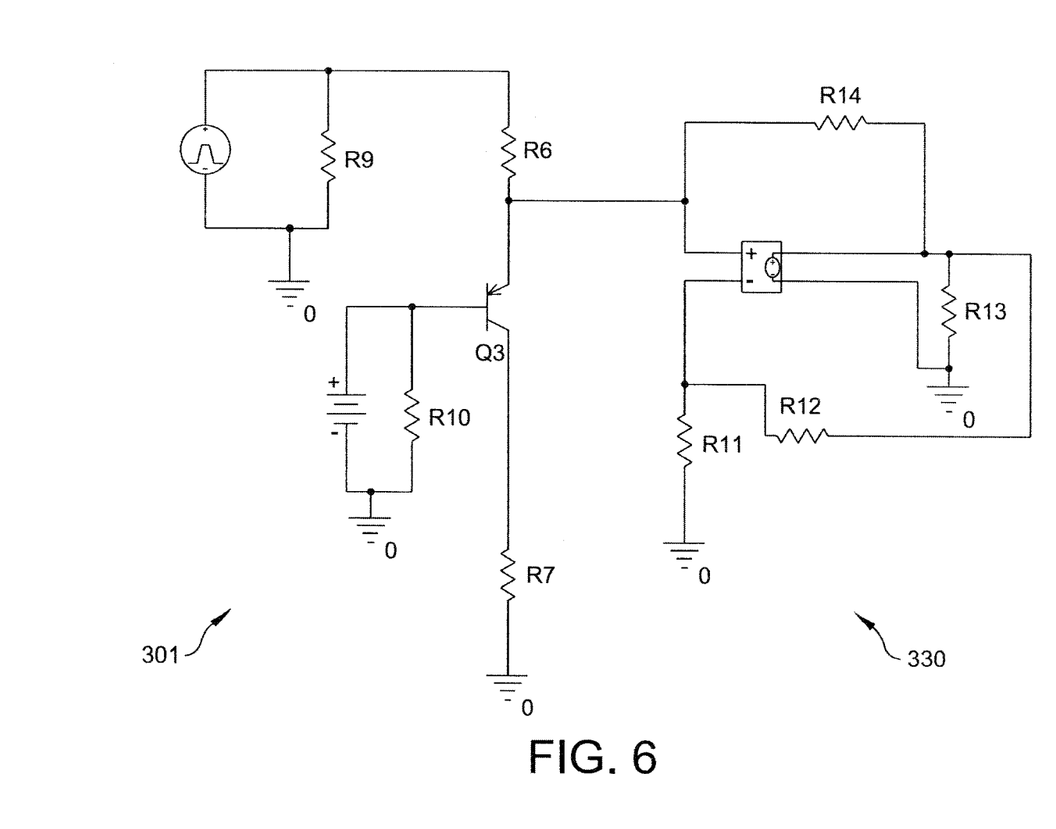
FIG. 6 is a circuit diagram of a voltage to current converter of an embodiment of the present invention having the compensating circuit attached thereto used in the simulation shown in FIG. 7.
Figure 7:
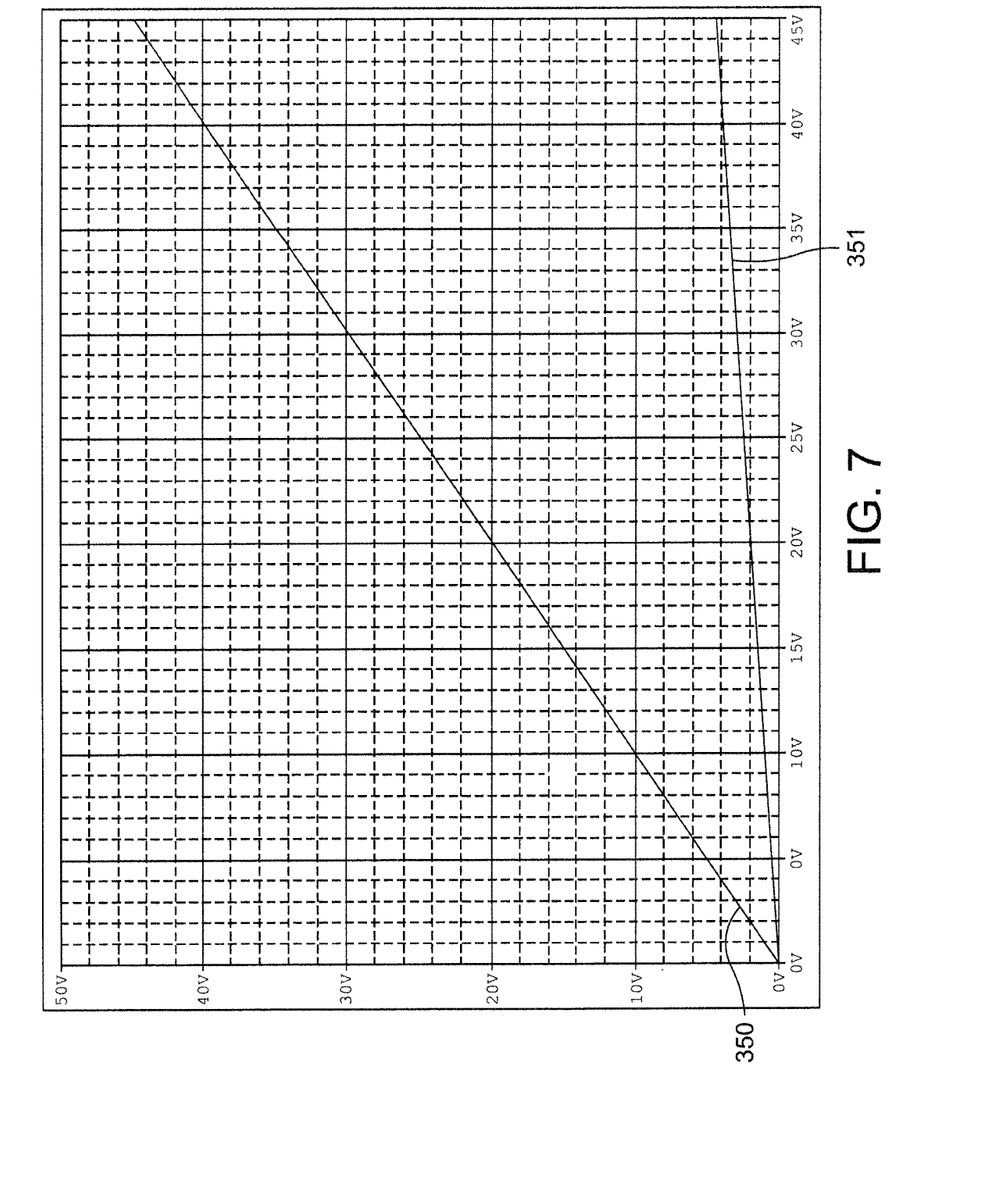
FIG. 7 is a plot showing input voltage and output voltage for the compensated circuit shown in FIG. 6.

FIG. 6 is a circuit diagram of a common-base transistor circuit 301 similar to that described above with respect to FIG. 3, with the compensating op-amp circuit 330 connected thereto. FIG. 7 shows a plot of the input voltage 350 and the output voltage 351 of the compensated converter 301 under simulation. With the compensating circuit 330 attached, voltage to current conversion is possible starting from an input voltage of zero, to the maximum input voltage. The output current is independent of the bias voltage as long as the transistor is operated in a non-saturated state.

While the foregoing describes exemplary embodiments and implementations, it will be apparent to those skilled in the art that various modifications and variations can be made to the present invention without departing from the spirit and scope of the invention.

What is claimed is:

1. A composite amplifier arrangement for voltage to current conversion comprising:
    an input voltage source arranged in series with the emitter terminal of a common-base transistor;
    a biasing voltage source connected to the base terminal of the common-base transistor; and
    an offset voltage compensating circuit comprising an operational amplifier operatively connected to the emitter terminal of the common-base transistor, the emitter terminal of the common-base transistor receiving the output of the offset voltage compensating circuit,
    wherein the offset voltage compensating circuit provides an output voltage sufficient to cancel an offset voltage error of the common-base transistor, and wherein the inverting terminal of the operational amplifier is connected to a negative feedback loop.

2. The composite amplifier arrangement of claim 1, wherein the negative feedback loop comprises at least one feedback resistor.

3. The composite amplifier arrangement of claim 2, wherein at least one resistor is arranged between the output of the operational amplifier and the emitter terminal of the common-base transistor.

4. The composite amplifier arrangement of claim 3, wherein the non-inverting terminal of the operational amplifier receives an offset voltage comprised of the base-emitter voltage of the common-base transistor and the bias supply voltage.

5. The composite amplifier arrangement of claim 4, wherein the ratio of the at least one feedback resistor and the resistor arranged between the output of the operational amplifier and the emitter terminal of the transistor is selected such that the operational amplifier provides an output voltage sufficient to cancel the offset voltage at the emitter terminal of the common-base transistor.

6. The composite amplifier arrangement of claim 1, further comprising a resistor arranged between the input voltage source and the emitter terminal of the operational amplifier.

7. The composite amplifier arrangement of claim 6, wherein the voltage to current conversion transfer function is based only on the value of the resistor.

8. The composite amplifier arrangement of claim 1, wherein the signal path of the offset compensating circuit is separate from the signal path created between the input voltage source and the emitter terminal of the common-base transistor.

9. A method of converting a voltage signal to a current signal comprising:
converting a voltage signal to a current signal through a first signal path defined between an input voltage source and the emitter terminal of a common-base transistor;
biasing the base terminal of the common-base transistor with a voltage source;
connecting an offset voltage compensating circuit to the emitter terminal of the common-base transistor; and
compensating for an offset voltage produced at the emitter terminal of the common-base transistor with the offset voltage compensating circuit,
wherein the offset compensating circuit comprises an operational amplifier, and wherein a negative feedback loop is connected to the inverting terminal of the operational amplifier.

10. The method of converting a voltage signal to a current signal according to claim 9, wherein the step of connecting an offset compensating circuit to the emitter terminal of the common-base transistor further includes connecting the non-inverting input terminal and the output terminal of the operational amplifier to the emitter terminal of the common-base transistor.

11. The method of converting a voltage signal to a current signal according to claim 9, wherein the step of converting a voltage signal further includes converting a voltage signal having a level below that of the circuit supply levels.

12. The method of converting a voltage signal to a current signal according to claim 9, wherein the step of converting a voltage signal further includes converting a voltage signal having a level above that of the circuit supply levels.

13. The method of converting a voltage signal to a current signal according to claim 9, further comprising the steps of:
providing at least one resistor in the negative feedback loop;
providing a resistor between the output of the operational amplifier and the non-inverting terminal of the operational amplifier; and
setting the ratios of the at least one resistor in the negative feedback loop to the resistor between the output of the operational amplifier and the non-inverting terminal such that the output of the operational amplifier compensates for the offset voltage produced at the emitter terminal of the common-base transistor.

14. A method of converting a voltage signal to a current signal comprising:
converting a voltage signal to a current signal through a first signal path defined between an input voltage source and the emitter terminal of a common-base transistor;
biasing the base terminal of the common-base transistor with a voltage source;
connecting an offset voltage compensating circuit to the emitter terminal of the common-base transistor; and
compensating for an offset voltage produced at the emitter terminal of the common-base transistor with the offset voltage compensating circuit, the emitter terminal of the common-base transistor receiving the output of the offset voltage compensating circuit,
wherein the offset voltage compensating circuit includes a negative feedback loop configured to provide, at the emitter terminal of the common-base transistor, an output voltage sufficient to cancel an offset voltage comprising the base-emitter voltage of the common-base transistor and the bias supply voltage.

15. The method according to claim 14, wherein the step of converting a voltage signal to a current signal further comprises providing a resistor between the input voltage source and the emitter terminal of the common-base transistor.

16. A composite amplifier arrangement for voltage to current conversion comprising:
an input voltage source arranged in series with the emitter terminal of a common-base transistor;
a biasing voltage source connected to the base terminal of the common-base transistor; and
an offset voltage compensating circuit operatively connected to the emitter terminal of the common-base transistor,
wherein the offset voltage compensating circuit includes a negative feedback loop configured to provide, at the emitter terminal of the common-base transistor, an output voltage sufficient to cancel an offset voltage comprising the base-emitter voltage of the common-base transistor and the bias supply voltage.

17. The composite amplifier arrangement according to claim 16, further comprising at least one resistor arranged between the output of the offset voltage compensating circuit and the emitter terminal of the common-base transistor.

18. The composite amplifier arrangement according to claim 16, wherein the offset voltage compensating circuit comprises an operational amplifier having a non-inverting terminal which receives an offset voltage comprised of the base-emitter voltage of the common-base transistor and the bias supply voltage.

19. The composite amplifier arrangement according to claim 17, wherein the negative feedback loop comprises at least one feedback resistor.

20. The composite amplifier arrangement of claim 19, wherein the ratio of the resistance values of the at least one feedback resistor and the at least one resistor arranged between the output of the offset voltage compensating circuit and the emitter terminal of the transistor is selected such that the offset voltage compensating circuit provides an output voltage sufficient to cancel the offset voltage at the emitter terminal of the common-base transistor.

* * * * *